United States Patent
Chen

(10) Patent No.: US 6,274,435 B1
(45) Date of Patent: Aug. 14, 2001

(54) HIGH PERFORMANCE MIM (MIP) IC CAPACITOR PROCESS

(75) Inventor: Chia Hsiang Chen, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/225,378

(22) Filed: Jan. 4, 1999

(51) Int. Cl.[7] .................................................. H01L 21/336
(52) U.S. Cl. ............................................................. 438/267
(58) Field of Search .................................. 257/304, 305, 257/311, 532, 303; 438/243, 386, 238, 239, 399, 267

(56) References Cited

U.S. PATENT DOCUMENTS

| | | | |
|---|---|---|---|
| 4,697,330 | 10/1987 | Paterson et al. | 437/42 |
| 4,959,705 | 9/1990 | Lemnios et al. | 357/51 |
| 4,971,924 | 11/1990 | Tigelaar et al. | 437/60 |
| 5,037,772 | 8/1991 | McDonald | 437/52 |
| 5,268,315 | 12/1993 | Prasad et al. | 437/31 |
| 5,338,701 | 8/1994 | Hsu et al. | 437/60 |
| 5,406,447 | 4/1995 | Miyazaki | 301/313 |
| 5,449,948 | * 9/1995 | Inoue et al. | 257/531 |
| 5,479,316 | 12/1995 | Smrtic et al. | 361/313 |
| 5,510,637 | * 4/1996 | Hsu et al. | 257/304 |
| 5,554,558 | 9/1996 | Hsu et al. | 437/60 |
| 5,576,240 | 11/1996 | Radosevich et al. | 437/60 |
| 5,589,416 | 12/1996 | Chittipeddi | 437/60 |
| 5,654,581 | 8/1997 | Radosevich et al. | 257/534 |
| 5,708,559 | 1/1998 | Brabazon et al. | 361/313 |
| 5,741,721 | 4/1998 | Stevens | 437/60 |

* cited by examiner

*Primary Examiner*—Matthew Smith
*Assistant Examiner*—Calvin Lee
(74) *Attorney, Agent, or Firm*—George O. Saile; Stephen B. Ackerman; Rosemary L. S. Pike

(57) ABSTRACT

A method for fabricating an improved metal-insulator-metal or metal-insulator-polysilicon capacitor having high capacitance density and low noise is achieved. An insulating layer is provided overlying a semiconductor substrate. A capacitor bottom plate electrode is formed overlying the insulating layer. A thin capacitor dielectric layer is deposited overlying the capacitor bottom plate electrode. An etch stop layer is deposited overlying the capacitor dielectric layer. A thick oxide layer is deposited overlying the etch stop layer. The oxide layer over the capacitor bottom plate electrode is etched away stopping at the etch stop layer whereby a recess is formed in the oxide layer overlying the bottom plate electrode wherein sidewalls of the oxide layer overlie the edges of the bottom plate electrode. A capacitor top plate electrode is formed within the recess whereby a guard ring is formed on the sidewalls of the oxide layer within the recess and wherein gaps are left between the capacitor top plate electrode and the guard ring. The top plate electrode is covered with a dielectric layer wherein the gaps are filled by the dielectric layer. A via opening is formed through the dielectric layer to the capacitor top plate electrode and filled with a patterned metal layer to complete formation of a capacitor in the fabrication of an integrated circuit device.

23 Claims, 4 Drawing Sheets

HIGH PERFORMANCE MIM (MIP) IC CAPACITOR PROCESS

BACKGROUND OF THE INVENTION (1) Field of the Invention

The present invention relates to a method of fabricating a metal-insulator-metal capacitor, and more particularly, to a method of forming a high capacitance metal-insulator-metal capacitor in the fabrication of an integrated circuit device.

(2) Description of the Prior Art

Capacitors are critical components in the integrated circuit devices of today. Both polysilicon and metal-insulator-metal (MIM) capacitors have been used in the art. The conventional MIM capacitor module which is inserted into the backend process of integrated circuit manufacturing results in a very low capacitance density. The capacitance density is proportional to the reverse of the dielectric thickness. Often, sophisticated additional metal and dielectric layers must be added for high capacitance density. FIG. 1 illustrates an example of a conventional MIM capacitor process. It is simple, but has a very low capacitance density. Bottom capacitor plate 30 is shown over semiconductor substrate 10. The metal bottom plate is covered by a thin oxide 32. Spin-on-glass material 34 fills the gaps between metal lines. A very thick oxide 36, more than about 1000 Angstroms in thickness and generally a few thousand Angstroms, forms the capacitor dielectric layer underlying the top plate electrode 40. The thick oxide is required for a low parasitic capacitance between the conducting layers and for good electrical isolation. In this example, the capacitance density F is approximately $10^{-17}$ farads/$\mu m^2$.

FIG. 2 illustrates an example of another conventional approach in which additional metal and thin oxide layers are added to improve capacitance density. A thin CVD oxide layer 38 is deposited over the bottom plate electrode 30. This oxide layer 38 has a thickness of approximately a few hundred Angstroms, for example about 500 Angstroms, and forms the capacitor dielectric. The metal layer 42 is formed over the capacitor dielectric. Then the sandwich dielectric layer comprising oxide 44, spin-on-glass 46, and oxide 48, is deposited over the metal layer 42. An additional metal layer 50 forms the upper plate electrode and contacts the lower metal layer 42 through a via opening. The metal layer 42 for circuit interconnection cannot be used directly as the upper electrode because of the thicker intermetal oxide required thereunder. In this example, the capacitance density F is approximately $6 \times 10^{-16}$ farads/$\mu m^2$. It is desired to have a capacitance density in the range of $10^{-15}$ to $10^{-16}$ farads/$\mu m^2$.

U.S. Pat. Nos. 5,576,240 and 5,654,581 to Radosevich et al, U.S. Pat. No. 5,479,316 to Smrtic et al, U.S. Pat. No. 5,708,559 to Brabazon, U.S. Pat. No. 5,406,447 to Miyazaki, U.S. Pat. No. 5,741,721 to Stevens, U.S. Pat. No. 4,959,705 to Lemnios et al, and U.S. Pat. No. 4,971,924 to Tigelaar et al all disclose various methods of forming metal-insulator-metal capacitors. U.S. Pat. No. 5,589,416 to Chittipeddi teaches fabrication of a metal-oxide-polysilicon capacitor. U.S. Pat. No. 5,554,558 to Paterson et al discloses a very high integrity capacitor dielectric in a polysilicon to polysilicon or polysilicon to metal capacitor. U.S. Pat. No. 5,268,315 to Prasad et al teaches silicon nitride as a capacitor dielectric in the fabrication of a MIM capacitor.

SUMMARY OF THE INVENTION

Accordingly, it is a primary object of the invention to provide an effective and very manufacturable process for producing a metal-insulator-metal capacitor.

Accordingly, it is a primary object of the invention to provide an effective and very manufacturable process for producing a metal-insulator-polysilicon capacitor.

Another object of the present invention is to provide a method for fabricating a metal-insulator-metal capacitor having high capacitance density.

A further object is to provide a method for fabricating a metal-insulator-metal or a metal-insulator-polysilicon capacitor having precise capacitor dielectric film control for high capacitance density.

A still further object is to provide a method for fabricating a metal-insulator-metal capacitor or a metal-insulator-polysilicon capacitor having a self-capacitor guard ring as a circuit noise screen.

Yet another object of the invention is to provide a method for fabricating a metal-insulator-metal or metal-insulator-polysilicon capacitor having high capacitance density and low noise.

In accordance with the objects of this invention, a method for fabricating an improved metal-insulator-metal or metal-insulator-polysilicon capacitor having high capacitance density and low noise is achieved. An insulating layer is provided overlying a semiconductor substrate. A capacitor bottom plate electrode is formed overlying the insulating layer. A thin capacitor dielectric layer is deposited overlying the capacitor bottom plate electrode. An etch stop layer is deposited overlying the capacitor dielectric layer. A thick oxide layer is deposited overlying the etch stop layer. The oxide layer over the capacitor bottom plate electrode is etched away stopping at the etch stop layer whereby a recess is formed in the oxide layer overlying the bottom plate electrode wherein sidewalls of the oxide layer overlie the edges of the bottom plate electrode. A capacitor top plate electrode is formed within the recess whereby a guard ring is formed on the sidewalls of the oxide layer within the recess and wherein gaps are left between the capacitor top plate electrode and the guard ring. The top plate electrode is covered with a dielectric layer wherein the gaps are filled by the dielectric layer. A via opening is formed through the dielectric layer to the capacitor top plate electrode and filled with a patterned metal layer to complete formation of a capacitor in the fabrication of an integrated circuit device.

Also in accordance with the objects of the invention, an integrated circuit device with capacitor is described. An interconnection line overlies an insulating layer on a semiconductor substrate. A first dielectric layer overlies the interconnection line wherein the first dielectric layer comprises a capacitor dielectric layer overlying the interconnection line, an etch stop layer overlying the capacitor dielectric layer, and an oxide layer overlying the etch stop layer. A metal line contacts the interconnection line through an opening in the first dielectric layer. The capacitor comprises a capacitor bottom plate electrode overlying the insulating layer on the semiconductor substrate, the capacitor dielectric layer overlying the capacitor bottom plate electrode, the etch stop layer overlying the capacitor dielectric layer, a capacitor top plate electrode overlying the etch stop layer over the capacitor bottom plate electrode within a recess formed in the oxide layer, and a guard ring on the sidewalls of the oxide layer within the recess wherein gaps are left between the capacitor top plate electrode and the guard ring. A second dielectric layer covers the metal line and the top plate electrode wherein the gaps are filled by the second dielectric layer. A patterned metal layer fills a via opening through the second dielectric layer to the capacitor top plate electrode.

BRIEF DESCRIPTION OF THE DRAWINGS

In the following drawings forming a material part of this description, there is shown.

DESCRIPTION OF THE PREFERRED EMBODIMENTS

Figure 3:
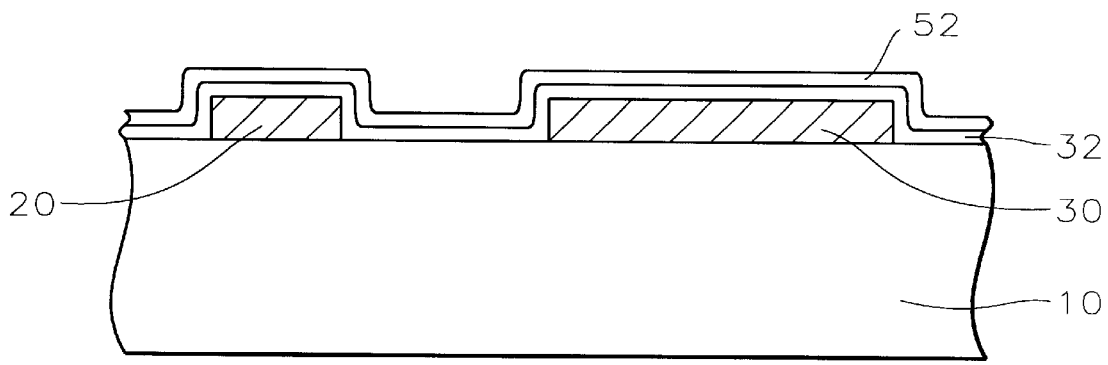
FIGS. 3 through 9 are schematic cross-sectional representations of a preferred embodiment of the present invention.

Referring now more particularly to FIG. 3, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions and lower level metal lines. The semiconductor device structures, not shown, may be formed in and on the substrate and covered with an insulating layer. These semiconductor device structures will be understood to be incorporated within substrate 10.

Next, metal lines 20 and 30 are formed as is conventional in the art. The metal line 30 will form the bottom plate of the capacitor. The metal lines 20 and 30 may comprise multi-layer metal films, for example, titanium nitride/AlCu/titanium nitride. Alternatively, if a MIP capacitor is to be formed, the lines 20 and 30 will be polysilicon lines. A MIM capacitor will be described and illustrated in the figures, but it is to be understood by those skilled in the art, that a MIP capacitor may be formed in a similar manner where lines 20 and 30 are polysilicon lines.

Figure 1:
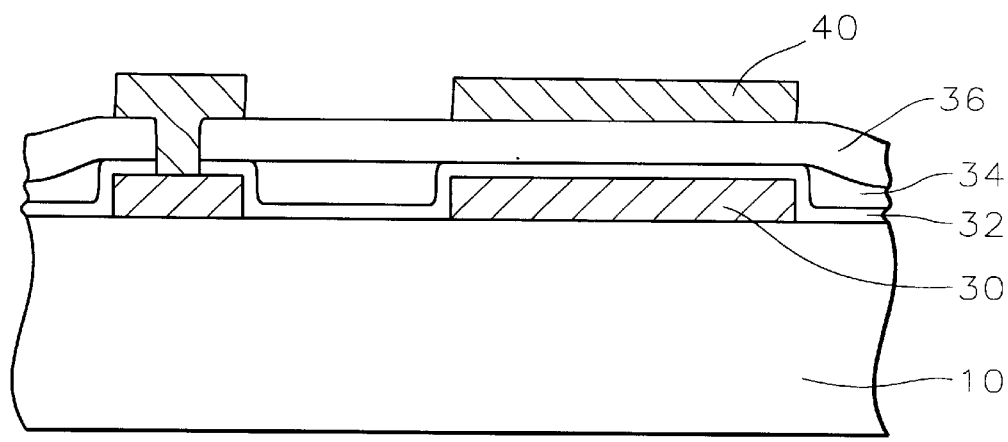
FIGS. 1 and 2 are schematic cross-sectional representations of processes of the prior art.
Figure 2:
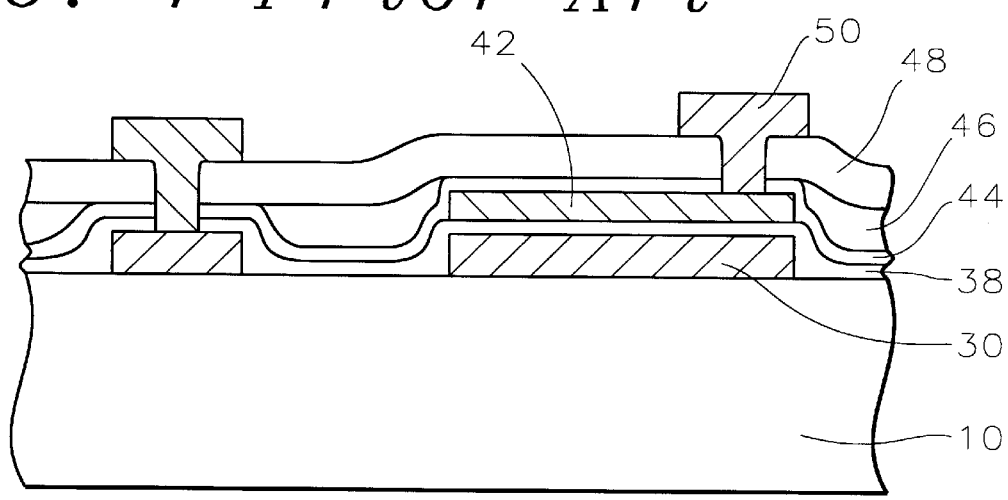

As shown in FIG. 2, the capacitor dielectric layer 32 is a silicon oxide layer deposited by chemical vapor deposition (CVD) to a thickness of between about 350 and 500 Angstroms. Next, a layer of silicon nitride 52 is deposited by CVD over the silicon oxide layer 32 to a thickness of between about 180 and 200 Angstroms. This layer will serve as an etch stop during the recessed oxide etching of the present invention.

Figure 4:
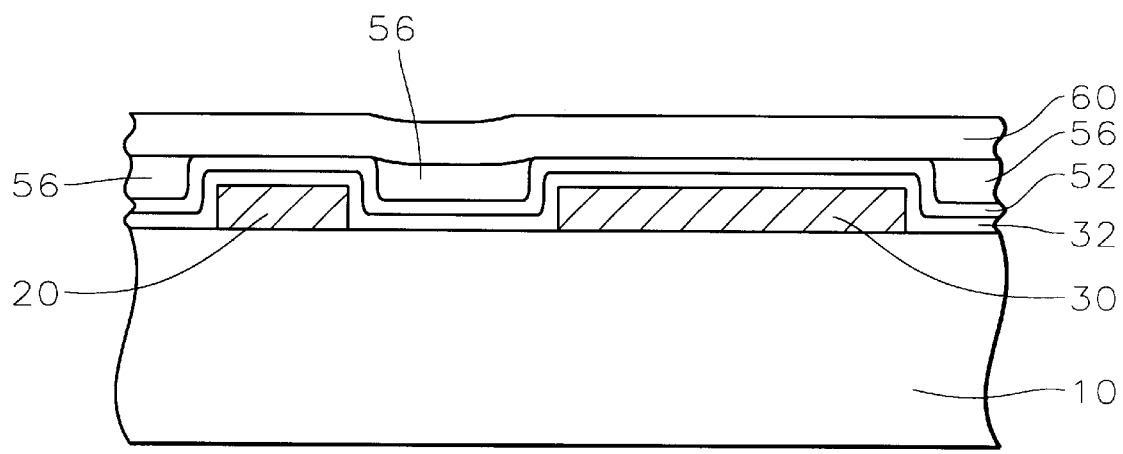

A spin-on-glass layer 56 is coated over the silicon nitride layer 52 and planarized using etchback or chemical mechanical polishing (CMP), for example, to fill the gaps between the metal lines, as shown in FIG. 4. Another silicon oxide layer 60 is deposited to a thickness of several thousands of Angstroms, and preferably between about 3000 and 5000 Angstroms over the substrate.

Figure 5:
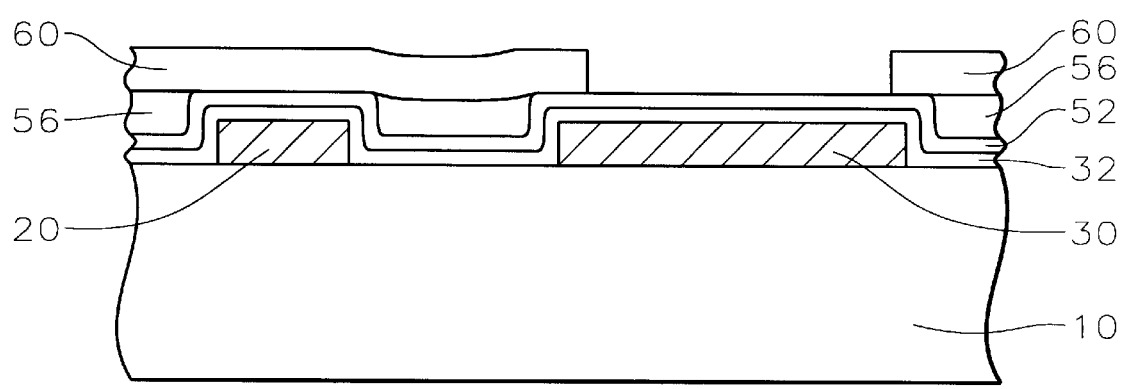

Referring now to FIG. 5, the capacitor area is exposed by etching away the thick oxide layer 60 using a dry etch with an etch stop at the silicon nitride layer 52. This recessed oxide etching allows for a thin capacitor dielectric in the capacitor area while maintaining the thick oxide layer 60 in the device area. It is important to have a thick oxide in the device area (line 20) for a low parasitic capacitance and good signal isolation between metal layers.

Figure 6:
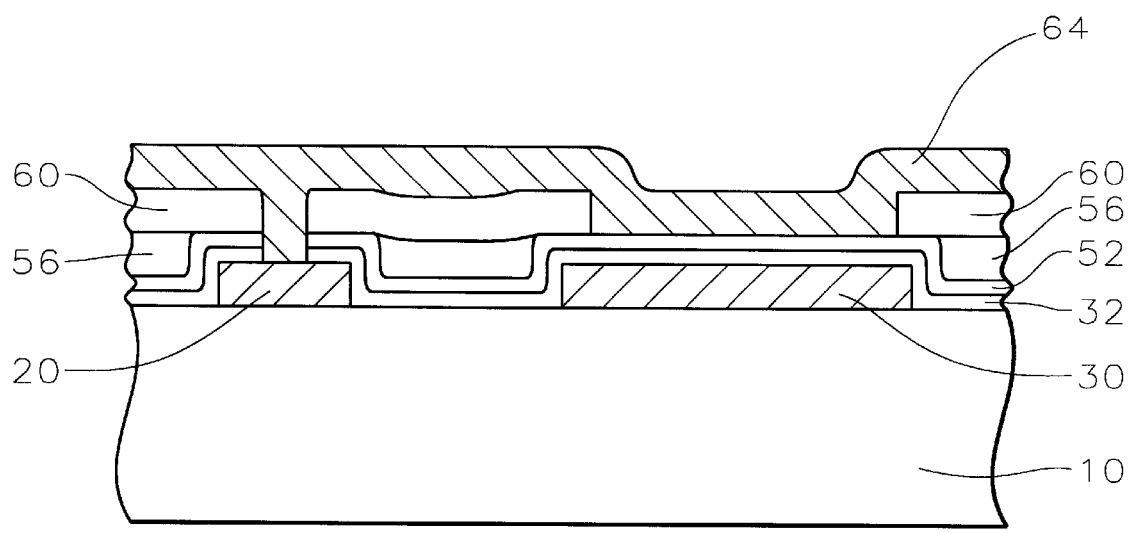

Referring now to FIG. 6, a via opening is etched through the dielectric layers to the metal line 20. A metal layer 64 is deposited over the substrate, within the via opening, and within the capacitor area opening.

Figure 7:
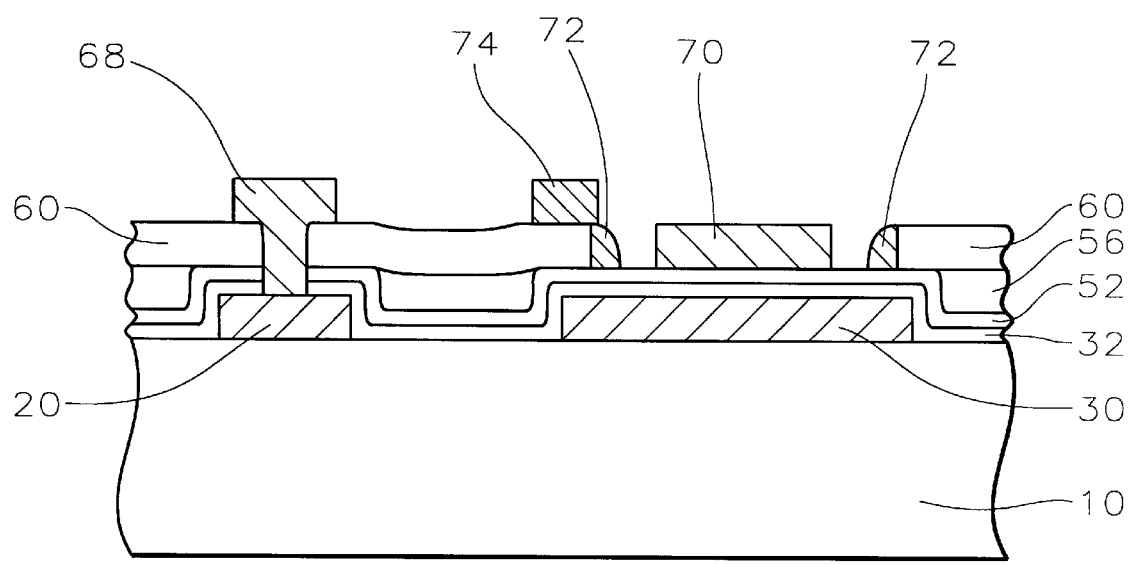

Referring now to FIG. 7, the metal layer 64 is patterned to form the metal contact 68 to metal line 20, upper plate electrode 70, and a self-guard ring 72. An anisotropic metal etching is used to pattern the metal layer 66. This will result in curved sidewalls of the thin metal areas 72 and vertical sidewalls for the wider metal areas 68 and 70. Metal area 74 forms a ground. Connecting the guard ring to the electrical ground level (74) will effectively screen the noise from outside the circuit.

Figure 8:
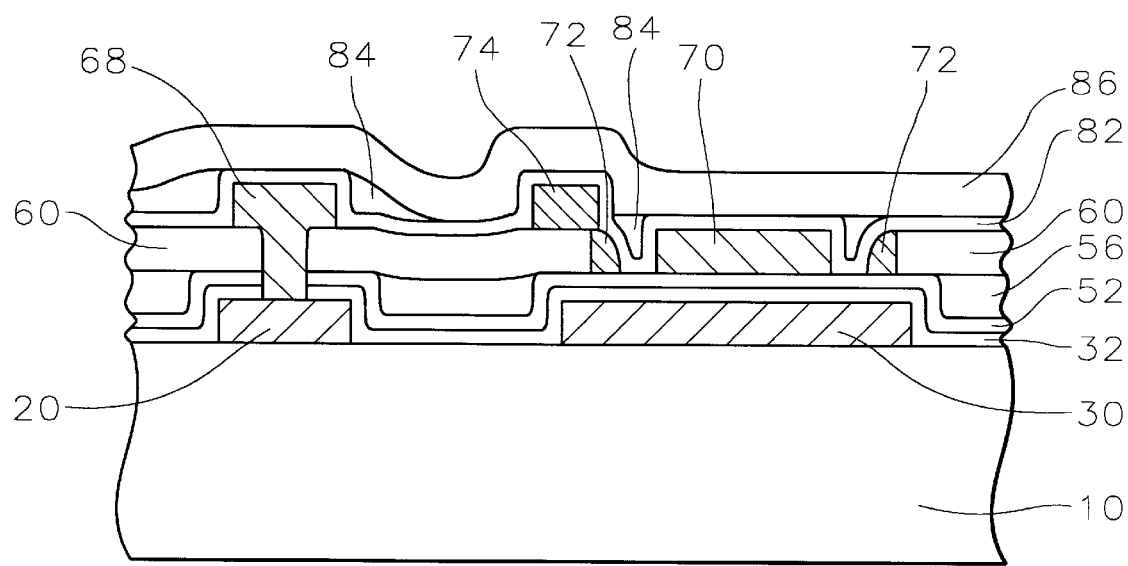

Referring now to FIG. 8, a sandwich dielectric layer is deposited over the metal layer, as shown. Silicon oxide layer 82 is deposited conformally over the metal areas. Spin-on-glass layer 84 is coated over the silicon oxide layer and planarized, such as by etchback or CMP, to fill the gaps between metal areas. A top layer of silicon oxide 86 completes the dielectric sandwich layer. This completes the MIM capacitor of the present invention.

Figure 9:
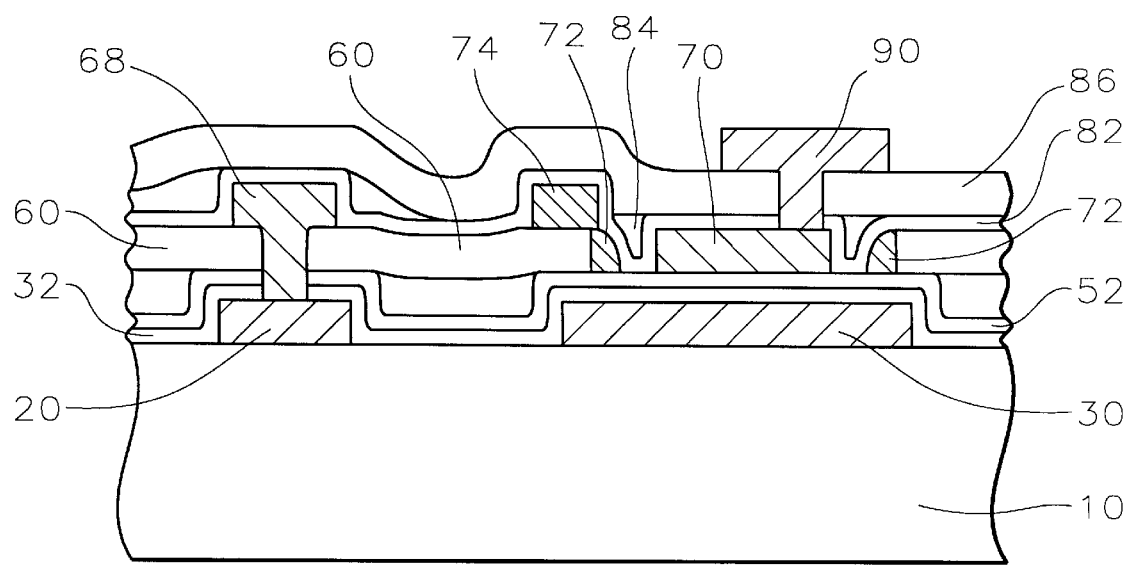

If desired in the circuit design, a via is opened through the dielectric layer to the upper plate electrode 70, as shown in FIG. 9. A metal layer 90 is deposited and patterned to contact the upper plate electrode. This additional metal contact is not required by the invention, but may be used if desired in the circuit design.

This completes the metal-insulator-metal capacitor of the present invention. Processing continues as is conventional in the art. The capacitance density F of the MIM or MIP capacitor of the present invention is approximately $10^{-15}$ to $10^{-16}$ farads/$\mu$m$^2$.

As discussed above, if a metal-insulator-polysilicon capacitor is to be formed rather than a MIM capacitor, the bottom electrode 30 will be formed of polysilicon. Instead of the thick CVD oxide 60, a material such as borophosphotetraethoxysilane (BP-TEOS) oxide, sub-atmospheric CVD oxide, or the like will be used. All other process steps are the same as those discussed for the MIM case.

The process of the present invention provides an effective and very manufacturable process for fabricating an improved metal-insulator-metal or metal-insulator-polysilicon capacitor. The process of the present invention is a new approach for high capacitance density that can be inserted easily into the conventional backend process. A thinner capacitor dielectric film that can be controlled more precisely can be achieved with the recessed oxide etching and etch stop dielectric layer of the present invention. The self-capacitor guard ring obtained in the process of the invention screens circuit noise resulting in a circuit having low noise.

The integrated circuit device with capacitor of the present invention will be described with reference to FIG. 9. An interconnection line 20 overlies an insulating layer on a semiconductor substrate 10. The interconnection line may be metal or polysilicon. A first dielectric layer overlies the interconnection line wherein the first dielectric layer comprises a capacitor dielectric layer 32 overlying the interconnection line, an etch stop layer 52 overlying the capacitor dielectric layer, and an oxide layer 60 overlying the etch stop layer. A metal line 68 contacts the interconnection line 20 through an opening in the first dielectric layer. The capacitor comprises first a capacitor bottom plate electrode 30 overlying the insulating layer on the semiconductor substrate 10. The capacitor bottom plate electrode may comprise metal if a MIM capacitor is formed or may comprise polysilicon if a MIP capacitor is formed. The interconnection line and the bottom plate electrode will comprise the same material. The capacitor dielectric layer 32 overlies the capacitor bottom plate electrode 30. The etch stop layer 52 overlies the capacitor dielectric layer 32. A capacitor top plate electrode 70 overlies the etch stop layer 52 over the capacitor bottom plate electrode 30 within a recess formed in the oxide layer 60. A guard ring 72 on the sidewalls of the oxide layer 60 within the recess acts as a circuit noise screen when connected to the ground 74. A second dielectric layer 82/84/86 covers the metal line 68 and the top plate electrode 70 and fills the gaps between the top plate electrode 70 and the guard ring 72. An optional patterned metal layer 90 fills a via opening through the second dielectric layer to the capacitor top plate electrode 70.

The integrated circuit device of the present invention includes a high performance MIM or MIP capacitor. The recessed oxide etching and silicon nitride etch stop layer of the present invention allow for a thin and precisely controlled capacitor dielectric layer in the capacitor area while providing for a thick oxide layer in the circuit area, such as over interconnection line 20. This provides for the desired high capacitance density of between about $10^{-15}$ to $10^{31\ 16}$ farads/$\mu m^2$ for the capacitor while providing a low parasitic capacitance and good electrical isolation in the device region. The self-capacitor guard ring guarantees a low noise integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a capacitor comprising:
   providing an insulating layer overlying a semiconductor substrate;
   forming a capacitor bottom plate electrode overlying said insulating layer;
   depositing a capacitor dielectric layer overlying said capacitor bottom plate electrode;
   depositing an etch stop layer overlying said capacitor dielectric layer;
   depositing an oxide layer overlying said etch stop layer;
   etching away said oxide layer over said capacitor bottom plate electrode stopping at said etch stop layer whereby a recess is formed in said oxide layer overlying said bottom plate electrode wherein sidewalls of said oxide layer overlie the edges of said bottom plate electrode;
   forming a capacitor top plate electrode within said recess whereby a guard ring is formed on said sidewalls of said oxide layer within said recess and wherein gaps are left between said capacitor top plate electrode and said guard ring; and
   covering said top plate electrode with a dielectric layer wherein said gaps are filled by said dielectric layer to complete formation of said capacitor in the fabrication of said integrated circuit device.

2. The method according to claim 1 wherein said semiconductor substrate includes semiconductor device structures such as gate electrodes and source and drain regions.

3. The method according to claim 1 wherein said semiconductor substrate includes semiconductor device structures such as gate electrodes and source and drain regions and multiple levels of metal interconnections.

4. The method according to claim 1 wherein said capacitor bottom plate electrode comprises metal.

5. The method according to claim 1 wherein said capacitor bottom plate electrode comprises polysilicon.

6. The method according to claim 1 wherein said capacitor dielectric layer comprises silicon oxide having a thickness of between about 350 and 500 Angstroms.

7. The method according to claim 1 wherein said etch stop layer comprises silicon nitride having a thickness of between about 180 and 200 Angstroms.

8. The method according to claim 1 wherein said oxide layer has a thickness of between about 3000 and 5000 Angstroms.

9. The method according to claim 1 wherein said capacitor top plate electrode comprises metal.

10. The method according to claim 1 wherein said guard ring screens out circuit noise.

11. The method according to claim 1 wherein said step of covering said top plate electrode with a dielectric layer comprises:
    depositing a first silicon oxide layer overlying said capacitor top plate electrode wherein said gaps remain between said top plate electrode and said guard ring;
    coating a spin-on-glass material layer overlying said first silicon oxide layer wherein said spin-on-glass material fills said gaps;
    etching back said spin-on-glass layer leaving said spin-on-glass layer only within said gaps; and
    depositing a second silicon oxide layer overlying said first silicon oxide layer and said spin-on-glass layer to complete said step of covering said capacitor top plate electrode.

12. The method according to claim 1 further comprising:
    forming a via opening through said dielectric layer to said capacitor top plate electrode; and
    filling said via opening with a patterned metal layer.

13. A method for fabricating a capacitor comprising:
    providing an insulating layer overlying a semiconductor substrate;
    forming a capacitor bottom plate electrode and an interconnection line overlying said insulating layer wherein a gap is formed between said bottom plate electrode and said interconnection line;
    depositing a capacitor dielectric layer overlying said capacitor bottom plate electrode and said interconnection line;
    depositing an etch stop layer overlying said capacitor dielectric layer;
    coating said etch stop layer with a spin-on-glass material layer wherein said gap is filled by said spin-on-glass material;
    planarizing said spin-on-glass material layer whereby said spin-on-glass material is left only within said gap;
    depositing an oxide layer overlying said planarized spin-on-glass layer;
    etching away said oxide layer over said capacitor bottom plate electrode stopping at said etch stop layer whereby a recess is formed in said oxide layer overlying said bottom plate electrode wherein sidewalls of said oxide layer overlie the edges of said bottom plate electrode;
    forming a first via opening through said oxide layer, said etch stop layer, and said capacitor dielectric layer to said interconnection line;
    depositing a first metal layer overlying said substrate and filling said first via opening and said recess;
    patterning said first metal layer to form a metal line contacting said interconnection line through said first via opening, to form a capacitor top plate electrode within said recess and to form a guard ring on said sidewalls of said oxide layer within said recess wherein gaps are left between said capacitor top plate electrode and said guard ring; and
    covering said patterned first metal layer over said interconnection line and said top plate electrode with a dielectric layer wherein said gaps are filled by said dielectric layer to complete formation of said capacitor in the fabrication of said integrated circuit device.

14. The method according to claim 13 wherein said semiconductor substrate includes semiconductor device structures such as gate electrodes and source and drain regions.

15. The method according to claim 13 wherein said semiconductor substrate includes semiconductor device structures such as gate electrodes and source and drain regions and multiple levels of metal interconnections.

16. The method according to claim 13 wherein said capacitor bottom plate electrode and said interconnection line comprise metal.

17. The method according to claim 13 wherein said capacitor bottom plate electrode and said interconnection line comprise polysilicon.

18. The method according to claim 13 wherein said capacitor dielectric layer comprises silicon oxide having a thickness of between about 350 and 500 Angstroms.

19. The method according to claim 13 wherein said etch stop layer comprises silicon nitride having a thickness of between about 180 and 200 Angstroms.

20. The method according to claim 13 wherein said oxide layer has a thickness of between about 3000 and 5000 Angstroms.

21. The method according to claim 13 wherein said guard ring is connected to a ground to screen out circuit noise.

22. The method according to claim 13 wherein said step of covering said patterned first metal layer and said top plate electrode with a dielectric layer comprises:

depositing a first silicon oxide layer overlying said patterned first metal layer and said capacitor top plate electrode wherein said gaps remain between said top plate electrode and said guard ring;

coating a spin-on-glass material layer overlying said first silicon oxide layer wherein said spin-on-glass material fills said gaps;

planarizing said spin-on-glass layer leaving said spin-on-glass layer only within said gaps; and depositing a second silicon oxide layer overlying said first silicon oxide layer and said spin-on-glass layer to complete said step of covering said patterned first metal layer and said capacitor top plate electrode.

23. The method according to claim 13 further comprising:

forming a second via opening through said dielectric layer to said capacitor top plate electrode; and filling said second via opening with a patterned second metal layer.

* * * * *